United States Patent [19]

Miyauchi et al.

[11] Patent Number: 4,987,559
[45] Date of Patent: Jan. 22, 1991

[54] SEMICONDUCTOR MEMORY DEVICE HAVING A PLURALITY OF ACCESS PORTS

[75] Inventors: Mayu Miyauchi; Satoru Kobayashi, both of Tokyo, Japan

[73] Assignee: NEC Corporation, Tokyo, Japan

[21] Appl. No.: 319,390

[22] Filed: Mar. 6, 1989

[30] Foreign Application Priority Data

Mar. 4, 1988 [JP] Japan .................................. 63-52213

[51] Int. Cl.$^5$ .............................................. G11C 7/00
[52] U.S. Cl. ........................ 365/189.04; 365/189.12; 365/230.05; 365/230.09; 365/240
[58] Field of Search ...................... 365/189.04, 230.05, 365/230.09, 240, 189.12

[56] References Cited

U.S. PATENT DOCUMENTS 4,689,741 8/1987 Redwine et al. ............... 365/230.05

Primary Examiner—James W. Moffitt
Attorney, Agent, or Firm—Sughrue, Mion, Zinn, Macpeak & Seas

[57] ABSTRACT

An improved semiconductor memory device in which serial read operations and serial write operations can be performed simultaneously is disclosed. The memory device comprises a memory array of memory cells, a random access port for accessing a desired one of memory cell in the array, a serial read circuit for sequentially reading data from the selected row one by one and a serial write circuit for operatively writing data sequentially applied to the selected row.

4 Claims, 6 Drawing Sheets

SEMICONDUCTOR MEMORY DEVICE HAVING A PLURALITY OF ACCESS PORTS

BACKGROUND OF THE INVENTION

1. Field of the Invention:

The present invention relates to a semiconductor memory device, and more particularly a multi-port memory device suitable for application to the video field.

2. Description of the Related Art:

A dual port memory device equipped with a random access port and a serial output port has been used as a video memory for storing image or video data. An example of the dual port memory device is disclosed in U.S. Pat. specification No. 4,633,441 issued to Ishimoto. The conventional dual port memory device is constructed as follows. A plurality of memory cells are arranged in a matrix form of rows and columns and one row of memory cells are read out at a time in parallel. The random access port selects one of the selected row of memory cells for read out or write in while the serial access port has a data register for storing data read from the selected row of memory cells and a serial read circuit for serially reading data stored in the data register one by one. Thus, in the conventional dual port memory device, data can be processed through the random access port while data can be serially accessed through the serial access port.

However, when the conventional dual port memory device is used as an image memory, it is not possible, for example to input a television image into the memory and to output image data on the real time basis to a CRT display while television image is being processed. Thus, in the conventional dual port memory, it is impossible to perform serial read and serial write operations simultaneously.

SUMMARY OF THE INVENTION

It is an object of the present invention to provide a semiconductor memory device having a serial read port and a serial write port for enabling simultaneous serial read and serial write operations.

It is another object of the present invention to provide a semiconductor memory device having high speed serial read and write functions.

The semiconductor memory device according to the present invention comprises a memory array of a plurality of memory cells arranged in rows and columns, a row selection circuit for selecting one of the rows, a random access port for selecting at least one column in accordance with column address information for reading or writing data, a serial read port for sequentially selecting the columns one by one for reading therefrom and a serial write port for sequentially selecting the columns for writing data thereto one by one.

According to the present invention, the random access port, the serial read port and the serial write port operate in parallel independently and therefore high speed and flexible serial read and serial write operations can be conducted.

In accordance with one aspect of the present invention, the serial write port and the serial read port are provided discretely, and first data latch means and first data transfer means are disposed on the serial write port side while second data latch means and second data transfer means are disposed on the serial read port side. The first data latch means serially inputs a series of data through the serial input port in accordance with a first clock signal and latches the data. The first data transfer means transfers in parallel the data latched by the first data latch means to the memory cells when the data are written. The second data transfer means transfers in parallel the series of data stored in the memory cells to the outside of the memory cells when the data are read out. The second data latch means latches the series of data transferred through the second data transfer means and outputs them serially through the serial read port in accordance with a second clock signal.

BRIEF DESCRIPTION OF THE DRAWINGS

The above and further objects, features and advantages of the present invention will become more apparent from the following detailed description taken in conjunction with the accompanying, drawings wherein.

DETAILED DESCRIPTION OF THE INVENTION

Figure 1:
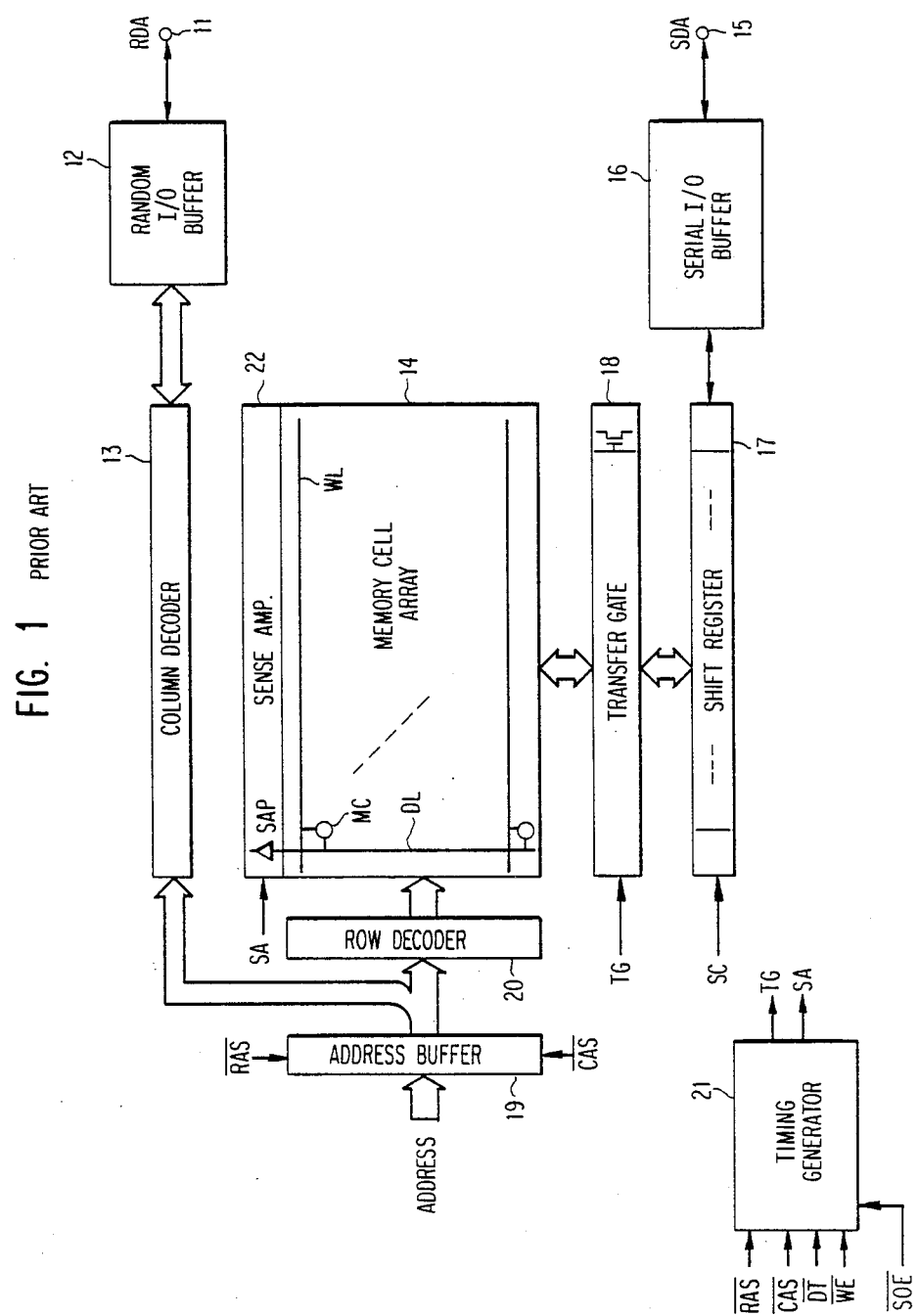
FIG. 1 is a schematic block diagram of a dual port memory device in the prior art.

Prior Art:

With reference to FIG. 1, the conventional dual port memory device will be explained. A memory cell array 14 includes word lines WL arranged in rows, digit lines DL arranged in columns and memory cells MC coupled to the word lines WL and the digit lines DL in a known manner. An address buffer 19 receives address signals and samples them as row address signals in response to the active level of a row address strobe signal $\overline{RAS}$ and as column address signals in response to the active level of a column address strobe signal $\overline{CAS}$, respectively in a known manner. A row decoder 20 selects one of the word lines WL in accordance with the row address signals. A sense amplifier section 22 includes a plurality of sense amplifiers SAP connected to the digit lines. A column decoder 13 selects the digit line to be accessed via a random input/output buffer 12 and a random access terminal 11 in accordance with the column address signals. The column decoder 13, the random input/output buffer 12 and the random access terminal 11 form a random access circuit.

A serial access circuit includes a transfer gate circuit 18, a shift register 17, a serial input/output buffer 16 and a serial access terminal 15. A timing signal generator 21 receives $\overline{RAS}$, $\overline{CAS}$, a data transfer signal $\overline{DT}$, a write enable signal $\overline{WE}$ and a serial output enable signal $\overline{SOE}$ and generates control signals for various blocks including a serial control clock signal SC for the shift register and a gate control signal TG for the transfer gate circuit 18.

The data transfer operation and serial input/output operation in this dual port memory will be explained with reference to the timing charts of FIGS. 2 and 3.

Figure 2:
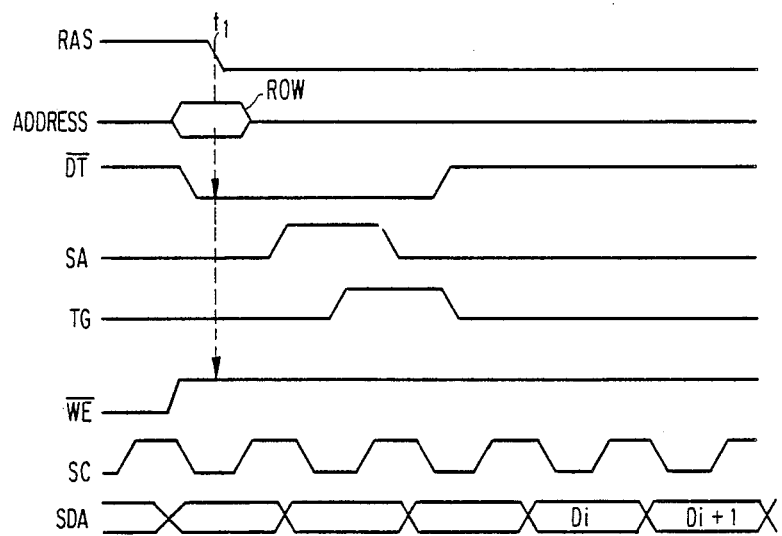
FIG. 2 is a timing diagram of serial read operation in the memory device of FIG. 1.

(1) Read data transfer and serial output operations:

In FIG. 2, when $\overline{RAS}$ falls at a time point $t_1$, the address buffer 19 receives the row address signals. The address buffer 19 converts the address data of an external TTL level to an internal MOS level and transfers them to the row decoder 20. The row decoder 20 receives the address data converted to the internal MOS level and selects only one word line in the memory cell array 14. On the other hand, since $\overline{DT}$ is at the low level and $\overline{WE}$ is at the high level at the time point $t_1$, the timing signal generator 21 judges that read data transfer is possible, and outputs a control signal SA. Receiving this control signal SA, each sense amplifier of the sense amplifier block 22 amplifies a very weak signal on the digit line read out from the memory cell array 14. Subsequently, the timing signal generator 21 generates the control signal TG, and the transfer gate 18 receives this signal and transfers in parallel the data amplified by the sense amplifier 22 to the shift register 17. Then, the shift register 17 outputs serially the transferred data in synchronism with the serial control clock signal SC through the serial data input/output buffer 16 and the serial input/output terminal 15.

Figure 3:
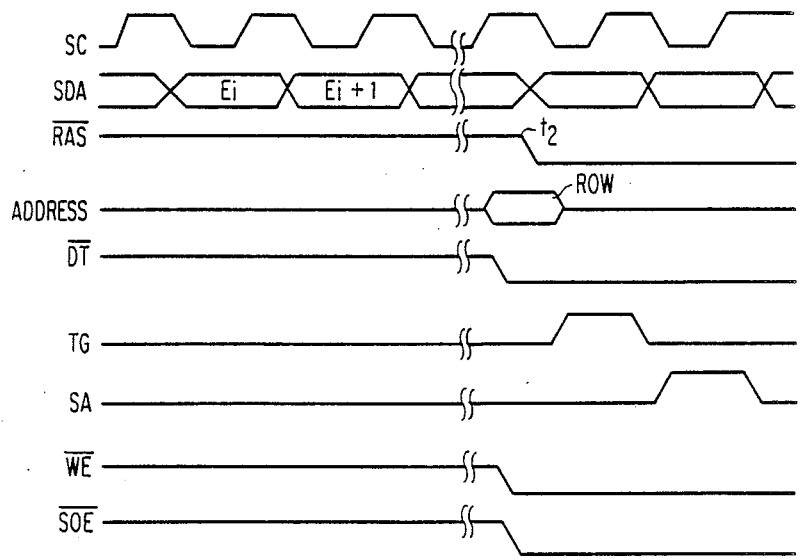
FIG. 3 is a timing diagram of serial write operation in the memory device of FIG. 1.

(2) Serial input and write data transfer:

In FIG. 3, the serial input data (SDA) from outside is sequentially inputted and latched by the shift register 17 through the serial input/output terminal 15 and the serial data input/output buffer 16 in synchronism with the SC signal. If $\overline{RAS}$ falls at a time point $t_2$, the address buffer 19 receives the row address. At this time, if $\overline{DT}$, $\overline{WE}$ and $\overline{SOE}$ are at the low level, the timing signal generator 21 judges that write data transfer is possible, and generates the control signal for each block of the memory device. Thereafter the memory cells connected to only one word line are selected in the same way as in the read data transfer operation, and thus data are written. At the time of the write operation, however, the generation sequence of the control signals TG and SA is reversed and after the shift data are transferred to the digit lines in the memory cell arrays, they are amplified by the sense amplifiers and restored in the memory cells in parallel.

In the conventional dual port memory described above, the data can be processed through the random access port while the serial data is either inputted or outputted through the serial input/output port. When this dual port memory is used as an image memory, however, it is not possible, for example, to input a television image into the memory and to output the image data on the real time basis to a CRT display while the television image is being processed. Thus, serial input and output cannot be made simultaneously because the serial port is only one.

Figure 4:
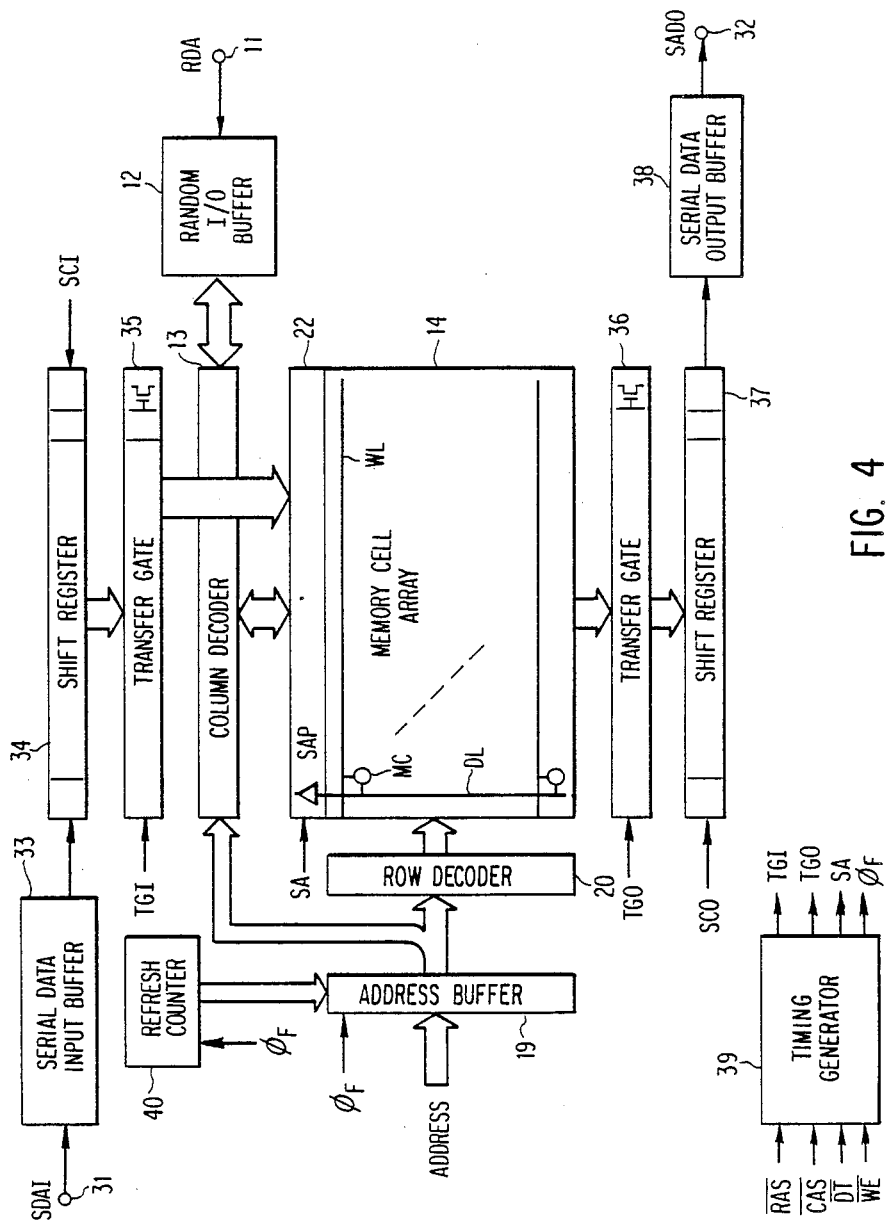
FIG. 4 is a schematic block diagram of a multi-port memory device according to a first preferred embodiment of the present invention.
Figure 5:
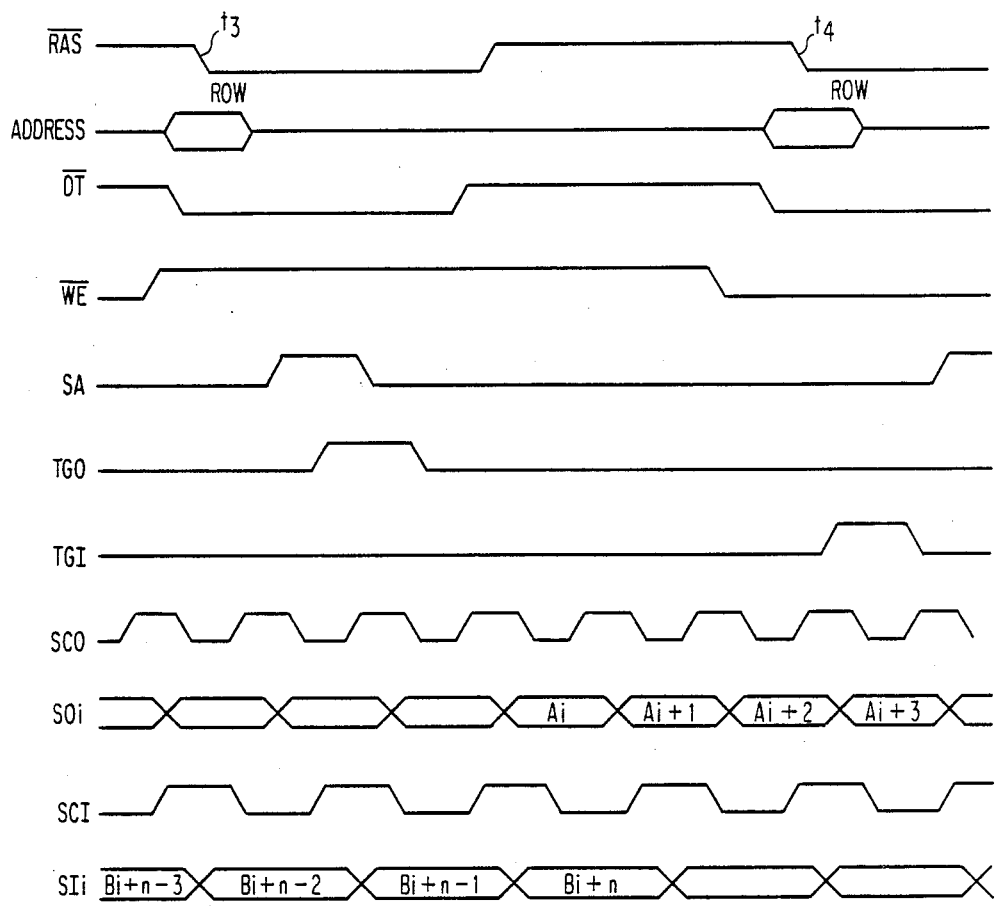
FIG. 5 is a timing diagram showing operations of the memory device of FIG. 4.

Embodiment of the Invention:

With reference to FIGS. 5 and 4, the memory device according to a first preferred embodiment will be explained.

FIG. 4 is a block diagram of the multi-port memory in accordance with the first embodiment of the present invention. Incidentally, like reference numerals are used in this FIG. 4 to identify like constituents as in FIG. 1 and their detailed explanation will be omitted.

As shown in FIG. 4, in place of the serial access circuit including the transfer gate circuit 18, the shift register 17, the serial input/output buffer 16 and the terminal 15 of FIG. 1, a serial read section including a transfer gate circuit 36, a shift register 37, a serial data output buffer 38 and a serial output terminal 32, and a serial write section including a shift register 34, a transfer gate circuit 35 for transferring data stored in the shift register 34 to the digit lines of the array in parallel, a serial data input buffer 33 and a serial input terminal 31 are employed. Also, in place of the timing signal generator 21, a timing signal generator 39 which receives $\overline{RAS}$, $\overline{CAS}$, $\overline{DT}$ and $\overline{WE}$ and generates a read transfer control signal TGO for enabling the transfer gate 36, a write transfer control signal TGI for enabling the transfer gate circuit 35, SA and a self refresh enable signal $\phi_F$ is employed. A refresh address counter 40 sequentially generates refresh row address information indicative of the word lines to be selected for refresh automatically without externally supplied row address signals when $\phi_F$ is present and the address buffer 19 transmitts the refresh row address information to the row decoder 20 in response to $\phi_F$. The signal $\phi_F$ is generated when $\overline{RAS}$ is kept non-active for a certain period or more by the timing signal generator 39.

The serial input data SDAI is written into the memory cell array 14 through the serial input terminal 31, the serial data input buffer 33, the shift register 34 and the transfer gate 35. The serial output data SDAO is read out from the memory cell array 14 and outputted serially through the transfer gate 36, the shift register 37, the serial data output buffer 38 and the serial output terminal 32.

The shift register 34 has a bit capacity capable of latching data derived from each word lines (i.e. the number of digit lines) selected by the row decoder 20 and shifts in and latches the serial input data SDAI in accordance with a serial input control clock SCI (first clock signal).

The transfer gate 35 serves as the first data transfer means which transfers the data latched by the shift register 34 to the memory cell array 14 at the time of the write operation. The transfer gate 36 transfers in parallel data derived from the memory cells connected to the word line selected by the row decoder 20 to the shift register 37 at the time of read operation. The shift register 37 shifts out the data transferred through the transfer gate 36 in accordance with a serial output control clock SCO.

Next, the operation of the serial input/output in the multi-port memory of the embodiment having the construction described above will be explained with reference to FIG. 5. If $\overline{RAS}$ falls at a time point $t_3$, the timing generator 39 judges the mode as the read data transfer cycle because $\overline{DT}$ is at the low active level and $\overline{WE}$ is at the high inactive level, and generates the control signal for each block inside the memory. Namely, it first generates SA and then TGO. In this manner the data derived from the memory cells connected to the word line selected by the row decoder 20 are read out to the shift register 37 via the transfer gate 36. Next, the shift register 37 shifts out the internal data stored therein to the outside through the serial data output buffer 38 and the serial output terminal 32 in synchronism with the SCO signal.

At the time of the serial write, the serial input data from outside are sequentially inputted and latched by the shift register 34 through the serial input terminal 31 and the serial data input buffer 33 in synchronism with the SCI signal. When $\overline{RAS}$ thereafter falls at a time point $t_4$, the timing generator 39 judges the mode as the write data transfer cycle because both $\overline{DT}$ and $\overline{WE}$ are at the low active level, and generates the control signal for each block in the memory. In other words, it first generates TCI and then SA. Accordingly, the data latched by the shift register 34 are written into the cells connected to the word line selected by the row decoder 20 of the memory cell array 14 and restored by the sense amplifiers SAP of the block 22.

In accordance with the embodiment described above, since the serial input terminal 31 and the output terminal 32 are completely independent, the SCO signal and the SCI signal may be completely asynchronous and the serial input/output operations can be made simultaneously.

Figure 6:
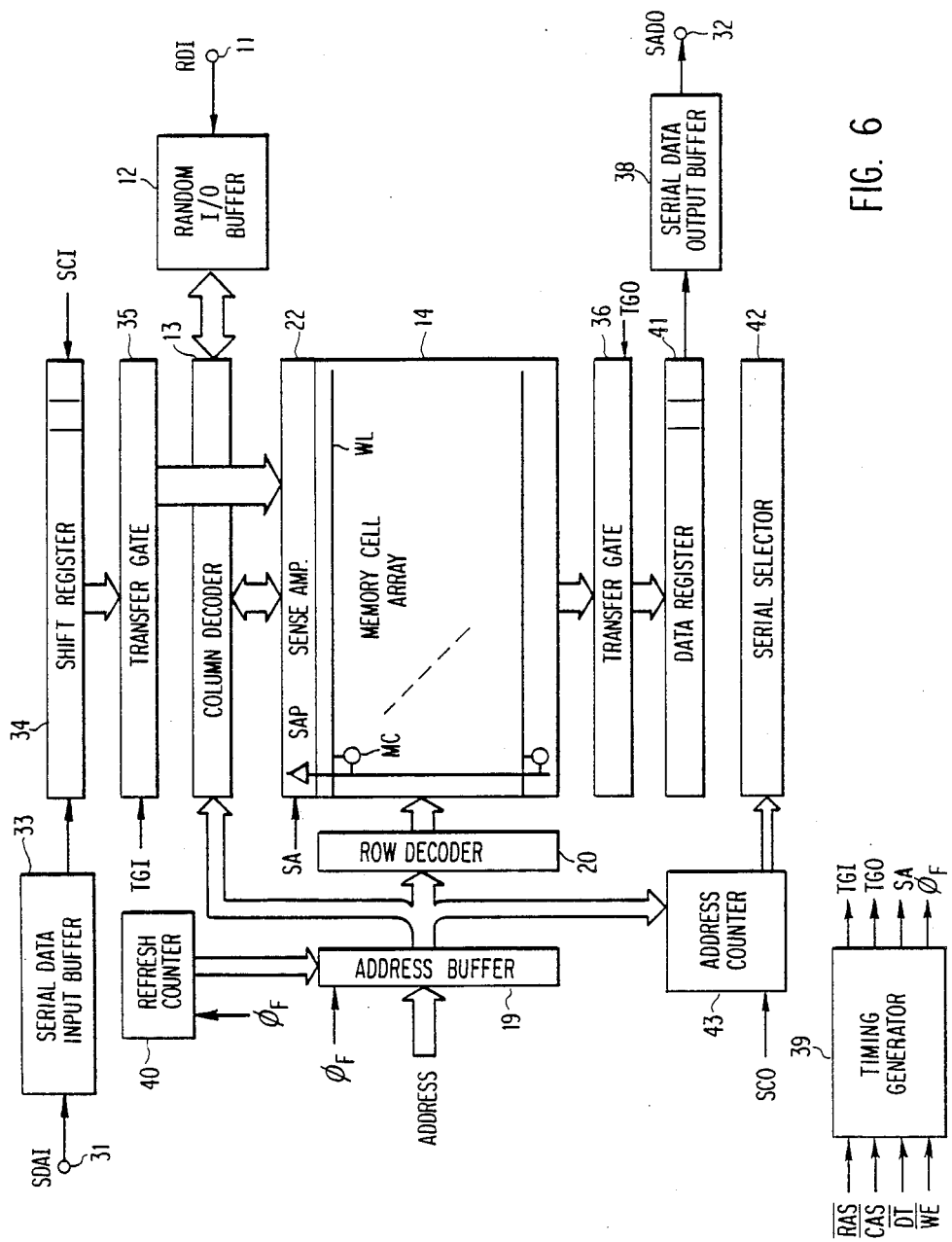
FIG. 6 is a schematic block diagram showing a dual-port memory device according to a second preferred embodiment of the present invention.

FIG. 6 is a block diagram of the multi-port memory in accordance with a second preferred embodiment of the present invention. In this embodiment, a data register 41, a serial selector 42 and an address counter 43 are employed in place of the shift register 37 in the foregoing embodiment of FIG. 4. The data register 41 is a circuit which can latch the data from the memory cells in parallel connected to one word line. The address counter 43 receives column address information through the address buffer 19 and delivers it to the selector 42 as the initial address position of the data register 41 to be outputted first and thereafter increments the address position sequentially. The selector 42 receives the read address given from the address counter 43 and selects one of the data inside the data register 41 to be outputted.

Figure 7:
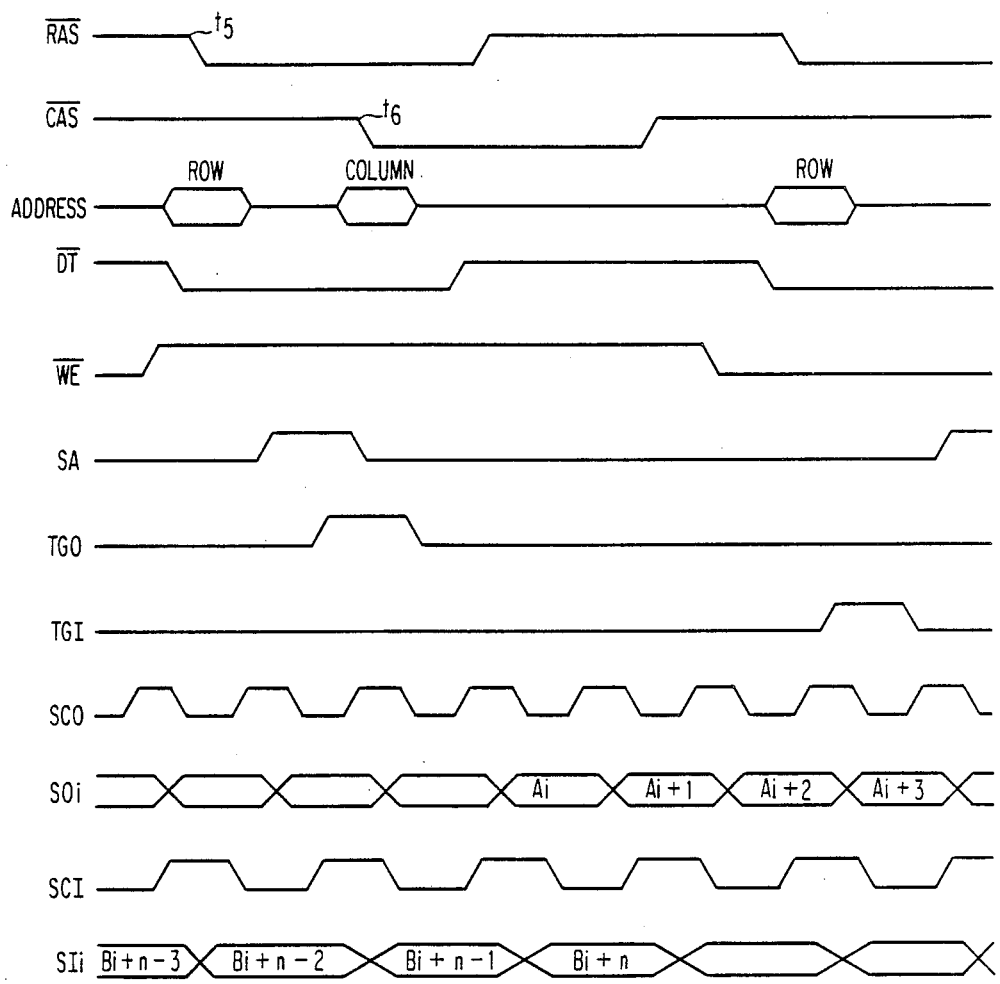
FIG. 7 is a timing diagram showing operations of the memory device of FIG. 6.

The data transfer and serial output operations in this embodiment will be explained with reference to the timing chart of FIG. 7.

When $\overline{RAS}$ falls at a time point t5, the address buffer 19 receives the row address. At this time point t5, $\overline{DT}$ and $\overline{WE}$ are rendered at the low level and the high level, respectively and the read data transfer cycle begins. The address buffer 19 converts the address input signals of the external TTL level to the internal MOS level and transfers them to the row decoder 20. The row decoder 20 receives the address data converted to the internal MOS level and selects only one word line among the memory cell array 14. Furthermore, the sense amplifiers SAP of the block 22 receives the control signal SA from the timing generator 39 and amplifies the very weak signals on the respective digit lines DL.

The transfer gate 36 is enabled to transfers the data on the digit lines to the data register 41. When the $\overline{CAS}$ signal falls at a time point t6, the address buffer 19 receives the column address. Similarly, the address buffer 19 converts the column address signals of the TTL level to the internal MOS level and transfers them to the address counter 43.

The column address data transferred to the address counter 43 sets the start position of the serial access through the selector 42. The address counter 43 and the selector 42 update sequentially the read position of the data transferred to the data register 41 in synchronism with the SCO signal. Accordingly, the data are shifted out from the data register 41 through the serial data output buffer 38 and the serial output terminal 32.

In this embodiment, since the shift register 37 is replaced by the address counter 43, the data register 41 and the selector 42, there can be obtained the advantage that the serial output can be started from an arbitrary address location.

Though the shift register in the embodiments described above has a single register structure, the gist of the present invention remains fundamentally unaltered even when a split register structure formed by dividing the shift register into two units or a double buffer structure formed by adding another register may be employed.

As described above, the present invention employs the structure wherein the serial input port and the serial output port are separated from each other and can operate independently of each other. Accordingly, the serial output can be made while the serial input is being made or the data inputted serially can be worked to make the serial output on the real time basis.

We claim:

1. A semiconductor memory device comprising a memory array of a plurality of memory cells arranged in a matrix form of rows and columns, means for selecting one of said rows thereby the enable the memory cells of the selected row for writing data thereto or reading data therefrom through said columns, a random access circuit coupled to said columns of said memory array for performing a random selection of said columns for reading data therefrom or writing data thereto in response to column address information, a first clock input terminal for receiving a first chain of clock signals, a second clock input terminal for receiving a second chain of clock signals, a serial output terminal, a serial output circuit coupled to said serial output terminal and said columns of said memory array for sequentially outputting at said serial output terminal data from said columns one by one in synchronism with said first chain of clock signals, a serial input terminal, an input register having a plurality of storage locations, a serial input circuit coupled to said serial input terminal and said input register for sequentially writing data applied to said serial input terminal to said input register one by one in synchronism with said second chain of clock signals, and a write circuit for operatively writing data stored in said input register to said columns in parallel simultaneously.

2. The memory device according to claim 1, in which said serial output circuit includes a shift register having a plurality of shift stages, and a transfer gate circuit coupled between said shift stages and said columns for operatively transferring data at said columns to said shift stages in parallel.

3. The memory device according to claim 1, in which said input register includes a shift register having a plurality of shift stages, and said write circuit includes a transfer gate circuit coupled between said plurality of shift stages and said columns for operatively transferring data stored by said plurality of shift stages to said columns in parallel.

4. The memory device according to claim 1, in which said serial output circuit includes a data register having a plurality of bit storages, a data transfer circuit connected between said plurality of bit storages and said columns, and a serial selection circuit coupled to said data register for sequentially selecting said bit storages one by one for reading out data therefrom.

* * * * *